THIN FILM NEGATIVE RESISTANCE SEMICONDUCTOR DEVICE

Filed March 23, 1965 2 Sheets-Sheet 1

INVENTOR
Yoshihiko Mizushima
Yoshitaka Igarashi
Osamu Ochi
BY Watson, Cole, Grindle and Watson
ATTORNEY Feb. 20, 1968 YOSHIHIKO MIZUSHIMA ETAL 3,370,208

THIN FILM NEGATIVE RESISTANCE SEMICONDUCTOR DEVICE

Filed March 23, 1965 2 Sheets-Sheet 2

INVENTORS

YOSHIHIKO MIZUSHIMA,
YOSHITAKA IGARASHI and
OSAMU OCHI

BY

WATSON, COLE, GRINDLE and WATSON

ATTORNEYS 3,370,208

THIN FILM NEGATIVE RESISTANCE SEMICONDUCTOR DEVICE

Yoshihiko Mizushima, Yoshitaka Igarashi, and Osamu Ochi, Tokyo, Japan, assignors to Nippon Telegraph and Telephone Public Corporation, Tokyo, Japan, a corporation of Japan Filed Mar. 23, 1965, Ser. No. 441,995
Claims priority, application Japan, Mar. 25, 1964, 39/16,362
4 Claims. (Cl. 317—234)

This invention relates to semiconductor devices.

An object of the present invention is to provide an active solid state device using a semiconductor, having negative resistance characteristics and favorable in performances.

The improvements over conventional ones are that (1) it is easy to make, (2) the difference between the discharging state and the nondischarging state is large or, in other words, the ON-OFF ratio is large, (3) its negative resistance appears in the positive and negative directions of current, (4) the switching speed is high, (5) it is a device in which the current is a many-valued function of the voltage and (6) the temperature of the characteristics varies little.

For the convenience of the explanation, such current-controlled type negative-resistance elements as are known as so-called germanium cryosar shall be considered as the first comparative examples. It is known that a germanium crystal which is impurity-compensated by mixing impurities and to which an ohmic contact electrode is attached has negative-resistance characteristics at very low temperature and that a silicon crystal to which an electrode composed mostly of gold is attached shows also negative-resistance characteristics at very low temperature.

The present invention relates to such devices which have negative resistance characteristics between two terminals, and that are easy to produce with excellent characteristics. That is to say, the device of the present invention is a negative resistance body needing no specific impurities to be mixed in, high in the switching speed and varying little in characteristics with changes of temperature. It can be used also as a high frequency pulse generator or a switching device.

Figure 1A:
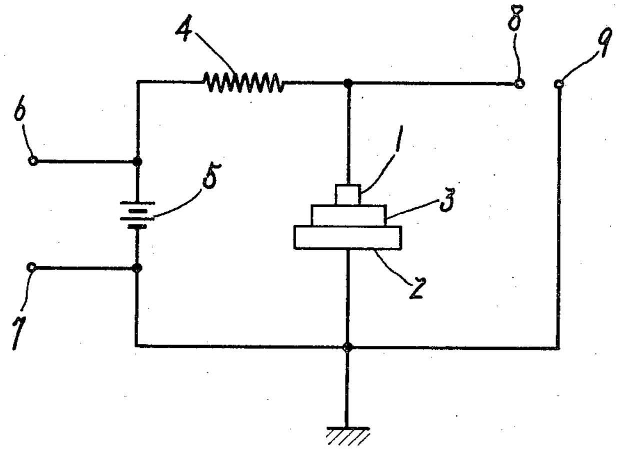
Figure 2A:
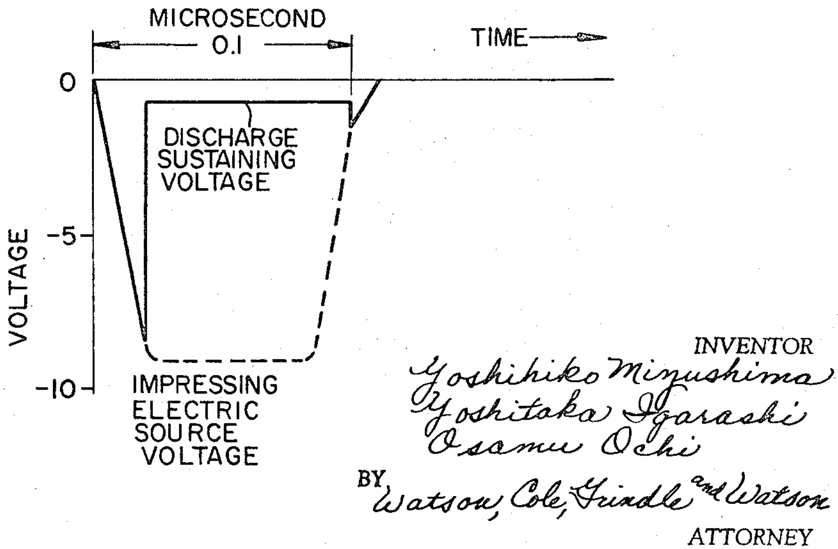
Figure 1B:
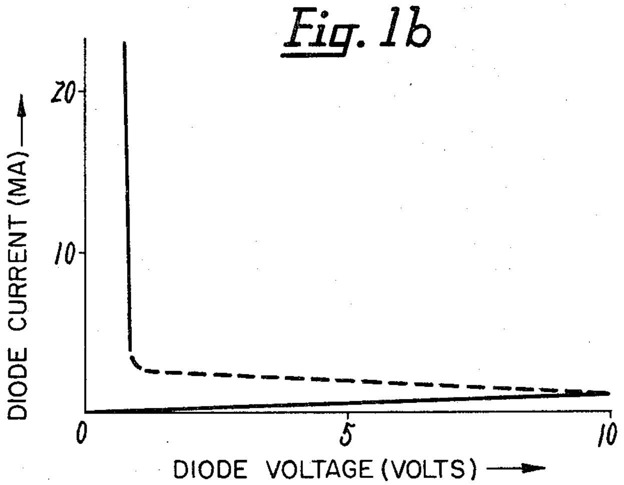
Figure 2:
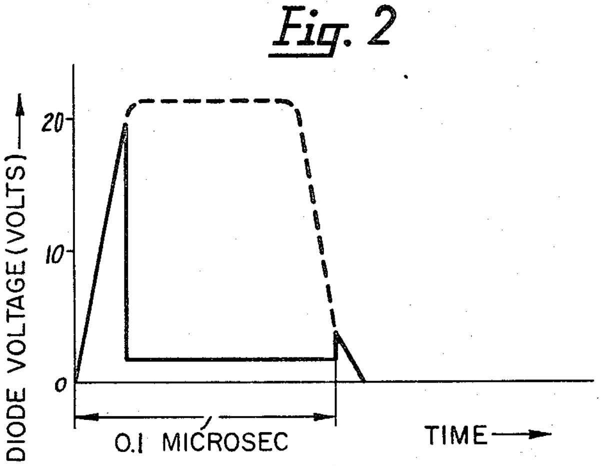

In the accompany drawings:

FIGURE 1*a* is a schematic view of a device constructed in accordance with the invention;

FIGURE 1*b* is a current-voltage characteristic diagram of a semiconductor device according to the present invention;

FIGURE 2 is a characteristic diagram showing time variations of a terminal voltage when a positive pulse voltage is impressed on a semiconductor device of the present invention; and FIGURE 2*a* is a characteristic diagram similar to FIGURE 2 showing time variations of a terminal voltage when a negative pulse voltage is impressed on a semiconductor device of the present invention.

The device of the present invention shall be explained with reference to the following example. FIG. 1*a* shows an embodiment of the present invention, which comprises two conductive electrodes 1 and 2 having therebetween a semiconductor layer 3. Both electrodes are connected to voltage source 5 through a resistor 4. Input terminals 6 and 7 are connected to the both sides of the voltage source 5. Output terminals 8 and 9 are connected to conductive electrodes 1 and 2. A molybdenum plate electrolytically polished to be smooth and clean was made a substrate, was heated in a vacuum apparatus at 700° C. with a heater. Two graphite crucibles were prepared as evaporating sources. Gallium and arsenic of high purity were respectively put into them. Then the former was kept at 1200° C., and the latter at 350° C., the vapors of gallium and arsenic reacted on the surface of the substrate and a thin film of a semiconductor of gallium arsenide was formed on the surface of the substrate. In such case, the layer forming velocity depended on the dimensions of the apparatus but was, for example, about 2 microns in 10 minutes. Though such layer was synthesized and deposited from a gas phase, when it was subjected to an X-ray diffraction analysis, no other substance or constituent element was seen to have mixed in or segregated. That is to say, a semiconductor layer having no impurity and in close contact directly with the molybdenum plate can be obtained. The substrate is a molybdenum plate having a thermal expansion coefficient equal to that of gallium arsenide deposited by evaporation. Not only molybdenum but also any other conductor which will support a film and act as an electrode will do including any conductive or low resistance metal or degenerate semiconductor.

Further, such semiconductor layer may be produced not only in a vacuum apparatus but also in a quartz tube. In the latter case, as the arsenic pressure within the tube can be elevated without any loss, the synthesizing reaction temperature can be raised and there is an advantage that the crystalline property of the produced semiconductor will be higher. Such arsenic gas which will react with gallium of low vapor pressure, to become a gas easily carrying gallium atoms to the surface of the reaction substrate without obstructing the synthesizing reaction. Also, for example, hydrogen, chlor or water vapor may be mixed in as a carrier gas. What is to be noted in such operation is to prevent impurities increasing conductivity from mixing in, which is different from the case of producing ordinary semiconductor crystals. It is possible to keep a high purity by preventing entry of impurities as much as possible and furthermore conductivity may be eliminated, for example, by mixing in oxygen.

The thickness of the thus produced semiconductor layer is selected to be about 100 Angstroms to 5 microns. It is desirable that the thickness does not exceed 10 microns at most, because otherwise the later described electric characteristics will remarkably deteriorate. A counterelectrode is made by depositing tellurium by evaporation in a vacuum so as to be 1,000 Angstroms thick over an area of 30 microns squared on such semiconductor film. The counterelectrode may be of any dimensions. Such electrode may be only in pressure contact with the metal qualitatively without deposition by evaporation. When the electrode is made by deposition or evaporation, other metals than tellurium as, for example, platinum, molybdenum, titanium and tungsten have the same effect. Further, a needle or plate electrode made of such metal may be brought into contact with the semiconductor or may be heated in contact with it so as to be affixed with the semiconductor.

The specific resistance in the direction of the thickness of the thus obtained film is $10^6$ to $10^8 \Omega$ as measured between both electrodes. When the measured voltage impressed on the film rises to reach a breakdown voltage or the turnover voltage $V_B$, the terminal voltage will reduce quickly and the current will increase quickly and will move to a new stable point determined by the load resistance. In the above mentioned example, such turnover voltage was 1 to 50 volts and was substantially proportional to the thickness.

The results of measuring these characteristics with an oscilloscope are shown in FIGURE 1*b* wherein the abscissa represents voltage between the terminals and the ordinate represents current values. As evident from this diagram, the device of the present invention has negative resistance characteristics. Further, it is found that, generally, when the counter electrode is arranged symmetrically, even if the direction of the current voltage is reversed, said characteristics will be the same and will have no specific directivity. This negative resistance belongs to a type usually classified as a discharge-tube type or a current-controlled type and is such negative resistance in which the current is a many-valued function with respect to the voltage. As seen in the diagram, the part representing the nondischarging state of a high resistance and the other part representing the discharging state of a low resistance consist substantially of a horizontal line and a vertical line, respectively, and vary from the one to the other substantially discretely. This is entirely different from the case of such slow negative resistance as is caused by a negative resistance-temperature coefficient by an ordinary current heat generation or as is based on a normally known principle. Therefore, also the terminal voltage in the discharging state is substantially constant irrespective of the current.

The time variations of the terminal voltage when a pulse voltage of a length of 0.1 microsecond was impressed on this device through a negative resistance of 5,000 ohms are as in FIGURE 2. It is found from this diagram that, when a turnover voltage is reached, the voltage will move to a discharging state and will reduce and that the discharge sustaining voltage $V_S$ in such case will be constant. In the example, the discharge sustaining voltage was 0.7 volt. The minimum value of the sustaining voltage was 0.65 volt varying slightly depending on the thickness. The above mentioned turnover voltage and discharge sustaining voltage are of values inherent to each device and their temperature variation is very little.

The higher the specific resistance of the semiconductor to be used, the better the characteristics, that is, the larger the ratio of the resistances of the nondischarging and discharging states can be made. However, according to experiments, any insulating semiconductor of more than about $10^3\Omega$ cm. shows acceptable characteristics. The insulating semiconductor so-called here does not include such substance as will become an insulator of more than about $10^{10}\Omega$ cm. in its highly purified state in the normal sense of the words. Therefore, in this case, such pure oxides as, for example, titanium oxide, aluminum oxide and silicon oxide, silicates and other salts containing oxygen and such halogen compounds as, for example, sodium chloride are not included. Such substance is an insulating compound and, according to experiments, in any case, it does not show such excellent characteristics as of the present invention. On the other hand, the gallium arsenide compound mentioned in the example is known to be of about $10^6\Omega$ cm. when highly purified and is an insulating semiconductor. Such substance has a covalent bonding property rather than an ionic bonding property and has therefore, a semiconductive property; and because its specific resistance is so high that it is an insulating semiconductor.

In considering it anew, when its forbidden band width so-called in physical terms (or the band-gap Eg) is too large, the substance will be an insulator and, when said width is too small, it will be a low resistance semiconductor. The insulating semiconductor exists intermediately between them. According to experiments, a substance of a band-gap of about 1 to 2.5 electron volts can be considered to be such insulating semiconductor, in which pure material can possess the above mentioned appropriate resistivity and show negative-resistance. Therefore, it has been confirmed by experiments that such an ordinary semiconductor which is of a small band-gap and is a high purity semiconductor as, for example, germanium, indium antimonide or indium arsenide has no large specific resistance and therefore has no characteristics of the device of the present invention.

Even if the gallium arsenide mentioned in the example has no impurity introduced specifically for the purpose of charge compensation, it will come to have the required property by the process of the example. Needless to say, such impurity compensating operation as will elevate the specific resistance may be carried out in such substance, the insulating semiconductor, according to any normally known process. The same characteristics can be obtained even by using an evaporatively deposited film of high purity silicon instead of gallium arsenide, because the specific resistance of said semiconductor film will become high. Also having characteristics desirable in the present invention are high purity silicon and cadmium selenide which are insulating semiconductors having a proper specific resistance in a pure state. It is found that such insulating semiconductors show the same switching characteristics as of gallium arsenide. For example, when a film of cadmium selenide was of a high purity, about the same values of the turnover voltage and discharge sustaining voltage as of gallium arsenide were obtained in the above mentioned thickness range. A film of high purity silicon was also the same. Such examples were quantitatively equal on the investigated insulating semiconductors. However, the switching speeds of most of them were lower than of gallium arsenide but were higher than $10^{-8}$ second.

Generally the discharge sustaining voltage of a conventional discharge-type negative resistance device is high. It has been theoretically considered that, specifically in an electron-avalanche-injection type discharge, utilizing a semiconductor, such voltage cannot become lower than such value a little higher than the value of the band-gap as, for example, 3/2 Eg. However, with gallium arsenide of the present invention, whereas Eg at the normal temperature is 1.4 volts a minimum of about 0.7 volt of the measured value of a discharge sustaining voltage has been obtained.

This shows that the device of the present invention is related with a new phenomenon and is not a device in which a discharge-avalanche phenomenon is merely applied. The above mentioned cryosar is considered to be an ionization avalanche from an impurity level. In such case, a sustaining voltage smaller than the band-gap is also theoretically considered. But then, the temperature fluctuation is so remarkable that, unless at a very low temperature, its effect will not be seen. The above mentioned characteristics of the device of the present invention were all measured at ambient temperature. Moreover, those characteristics will not be so different quantitatively even as cooled to such low temperature as of liquid air or at such high temperature as about 100° C. According to actual measurements, when the temperature was made to fluctuate by 50° C. above and below the room temperature, the variation of each voltage was less than 5 percent. In the normal case, the temperature variation is less than $10^{-2}$ per degree. That is to say, the device of the present invention has a characteristic of a small temperature variation and is substantially different from cryosar which operates only at a very low temperature.

As evident from the above mentioned producing process, the device of the present invention has no impurity specifically mixed in. The gallium arsenide mentioned as an example is synthesized of such high purity constituents as of about 99.9999% and does not make it a required condition of the negative resistance to be compensated by consciously mixing in impurities as in cryosar. The present invention makes one of sufficient conditions that the specific resistance should be high and specifically requires no impurity level.

Further, the so-called switching speed which is the speed of the transition to a discharge state is less than about $4\times10^{-10}$ second. The reverse switching speed of the return to the nondischarging state from the discharging state is less than about $3\times10^{-9}$ second. This means that the switching speed of the device of the present invention is much higher than the switching speed utilizing a known conventional discharge tube type negative resistance. Further, with respect only to the fact that the discharge sustaining voltage is low, a PNPN device utilizing a multilayer PN junction is of the same discharge sustaining voltage as of the device of the present invention. However, its switching speed is so low as to be about $10^{-6}$ second. Therefore, in considering the characteristics of both, it is clear that the device of the present invention is superior. Further, a double-injection discharge-tube type negative resistance utilizing a PIN junction is also well known. But, it also has a defect that its switching speed and ON-OFF ratio as in the present invention without utilizing a PN junction is low. There is no other device in which a high speed is obtained.

According to experiments, it is found that such switching speed as is usually obtained is higher than about $10^{-8}$ second and that its value is variable depending on the thickness and producing process. In the case of a semiconductor, there is also a negative resistance by a thermal temperature rise. For also the distinction from it, the fact that the switching speed is higher than $10^{-8}$ second is also considered to be one of the features of the device according to the present invention.

Generally such slow negative resistance has small gradient and is different from such sharp characteristics as in the present invention. The fact that such discharge sustaining voltage is not substantially related with a passing current but has a constant value is an excellent property not seen in any other conventional solid negative resistance element. Thus, the discharge state and its sustaining voltage can be defined almost irrespective of the passing current. The ON-OFF ratio, defined here as the ratio of the resistivities of the nondischarging state to that of the discharging, is over $10^2$, typically $10^4$ in the above-mentioned example. Further, the device utilizing a PN junction has defects that it is difficult to produce and is likely to be costly. As seen also in the above explanation, the device of the present invention is easy to produce and is low in cost.

It is known in electric circuits that such negative resistance characteristics are accompanied with an oscillating phenomenon. That is to say, by properly selecting the load impedance and the structure of the electrode, such oscillating waveforms can be simultaneously observed. The device of the present invention is so small as a switching device, its speed is so high, its sustaining voltage is so small and its loss is so small that a high frequency oscillating phenomenon will easily occur and the oscillation efficiency will reach about several percent of the impressed direct current electric power. Thus the device of the present invention can be used also for high frequency generating apparatus or frequency multiplying apparatus.

If the thickness of the semiconductor film of the device of the present invention is increased to be, for example, more than about 10 microns, there will be such disadvantageous results that the electric current power loss due to current at the time of discharge will increase, the temperature rise and the breakdown of the device will be likely to occur and the switching speed will become low. There is known no example in which a device thinner than 10 microns was successfully applied to cryosar or any other discharge-type negative resistance element. The fact that excellent characteristics are shown only in such thin semiconductor layer shows the peculiarity of the device of the present invention.

Further, in the device of the present invention, it is easy to deposit by evaporation a plurality of electrodes as arranged on a film of the obtained semiconductor and to provide electrode lead wires from the respective electrodes. Therefore, the present invention is adapted to the requirement for making parts small in using many devices as collected as elements of a memory circuit or a logic circuit.

Further, the device of the present invention shows a phenomenon that, when it moves to a discharging state, the turnover point will be shifted by a light projected from outside. Though this is a natural conclusion as electrons will be excited by a photoelectric effect, it means that the device of the present invention has a possibility of being used as a bistable device controllable by a projected light.

What is claimed is:

1. A semiconductor device comprising a substantially pure semiconductor layer having a wide energy band gap capable of current controlled type negative resistance characteristics disposed directly between opposed conductive electrodes, said electrodes consisting of a first conductive electrode consisting of a metal selected from the group consisting of Te, Pt, Mo, Ti and W and a second electrode consisting of a metal having a thermal expansion coefficient substantially identical with that of said semiconductor, the sustaining voltage of said negative resistance being smaller than the turnover voltage and not more than 3/2 of the band gap energy of said semiconductor, said semiconductor layer having a thickness of between less than 5 microns and more than 100 Angstroms and having a specific resistance of more than $10^3\Omega$ cm. but less than $10^{10}\Omega$ cm., said semiconductor layer being crystalline and substantially free of oxides and halides, whereby said negative resistance appears in both positive and negative directions of current.

2. A semiconductor device as claimed in claim 1, wherein said substantially pure semiconductor layer consists of gallium arsenide.

3. A semiconductor device as claimed in claim 1, wherein said substantially pure semiconductor layer consists of silicon.

4. A semiconductor device as claimed in claim 1, wherein said substantially pure semiconductor layer consists of cadmium selenide.

References Cited

UNITED STATES PATENTS

| | | | |
|---|---|---|---|
| 2,948,837 | 8/1960 | Postal | 317—234 |
| 3,056,073 | 9/1962 | Mead | 317—234 |
| 3,241,009 | 3/1966 | Dewald et al. | 317—235 |
| 3,284,676 | 11/1966 | Izumi | 317—234 |
| 3,304,471 | 2/1967 | Zuleeg | 317—234 |

FOREIGN PATENTS

| | | |
|---|---|---|
| 1,352,381 | 1/1964 | France. |

JOHN W. HUCKERT, *Primary Examiner.*

J. D. CRAIG, *Assistant Examiner.*